United States Patent
Reime

(10) Patent No.: US 8,823,394 B2
(45) Date of Patent: Sep. 2, 2014

(54) APPARATUS FOR CAPACITIVELY MEASURING CHANGES

(76) Inventor: Gerd Reime, Buhl (DE)

( * ) Notice: Subject to any disclaimer, the term of this patent is extended or adjusted under 35 U.S.C. 154(b) by 174 days.

(21) Appl. No.: 13/056,862

(22) PCT Filed: Jul. 31, 2009

(86) PCT No.: PCT/EP2009/005550
§ 371 (c)(1),
(2), (4) Date: Jan. 31, 2011

(87) PCT Pub. No.: WO2010/012480
PCT Pub. Date: Feb. 4, 2010

(65) Prior Publication Data
US 2011/0133756 A1   Jun. 9, 2011

(30) Foreign Application Priority Data

Jul. 31, 2008   (DE) .......................... 10 2008 035 627

(51) Int. Cl.
*H03K 17/95* (2006.01)
*B07C 5/34* (2006.01)

(52) U.S. Cl.
USPC ........................... 324/658; 324/661; 324/662

(58) Field of Classification Search
CPC .... B07C 5/344; B41F 31/022; H03K 17/955; G01R 1/0441
USPC ...... 379/420; 73/862.337, 862.626; 340/854.8, 870, 856.3, 854.6, 340/562–564, 686.6, 690; 341/33; 361/271; 324/658–659, 661–663, 679, 681, 683, 324/686–688, 690, 716
See application file for complete search history.

(56) References Cited

U.S. PATENT DOCUMENTS 4,752,727 A * 6/1988 Schneider ..................... 324/605
(Continued)

FOREIGN PATENT DOCUMENTS

| CH | 661391 | 7/1987 |
|---|---|---|
| DE | 2239359 | 2/1974 |
| DE | 2739786 | 3/1979 |
| DE | 3221223 | 12/1983 |

(Continued)

OTHER PUBLICATIONS

International Search Report; PCT/EP2009/005550 dated Oct. 28, 2009.

*Primary Examiner* — Arleen M Vazquez
*Assistant Examiner* — Hoang X Nguyen
(74) *Attorney, Agent, or Firm* — Cantor Colburn LLP

(57) ABSTRACT

An apparatus for capacitively measuring changes has a sensor (S) with a sensor-active region. The sensor has at least one transmitting electrode, which generates an electric field, and a further electrode (13) which is capacitively coupled to the transmitting electrode (15), wherein the transmitting electrode (15) is arranged between the further electrode (13) and an element (11) which is at a reference potential. An output of a driver/evaluation unit (5.0) is coupled to the transmitting electrode (15) and an input of the driver/evaluation unit (5.0) is coupled at high impedance to the further electrode (13), an electric field forming between the further electrode (13) and a reference potential on account of the electric field, generated by the transmitting electrode (15), between the transmitting electrode (15) and the further electrode (13). A change in the capacitance between the further electrode (13) and the reference potential is thus detected using the driver/evaluation unit (5.0). This provides a capacitive sensor which can be used to reliably detect changes in the sensor environment and is insensitive to a reference potential even in the case of a coating (18) or wetting (18).

11 Claims, 3 Drawing Sheets

(56) References Cited

U.S. PATENT DOCUMENTS

| | | | | |
|---|---|---|---|---|
| 5,053,715 A | * | 10/1991 | Andermo | 324/662 |
| 5,123,039 A | * | 6/1992 | Shoulders | 378/119 |
| 5,844,415 A | * | 12/1998 | Gershenfeld et al. | 324/663 |
| 7,019,540 B2 | | 3/2006 | Yakabe et al. | |

FOREIGN PATENT DOCUMENTS

| | | |
|---|---|---|
| DE | 4006119 | 8/1991 |
| DE | 69719321 | 10/2003 |
| GB | 2394775 | 5/2004 |
| WO | 2006025003 | 3/2006 |

* cited by examiner

APPARATUS FOR CAPACITIVELY MEASURING CHANGES

REFERENCE TO RELATED APPLICATIONS

The present application claims the priority of the German patent application 10 2008 035 627.1, filed on 31 Jul. 2008, the published content of which is hereby expressly incorporated in the subject matter of the present application.

TECHNICAL FIELD

The invention relates to an apparatus for the capacitive measurement of changes within a sensor-active region of a sensor utilizing the production of an electrical field.

BACKGROUND

A capacitive distance sensing system is known from DE 40 06 119 C2. The system consists of a sensor or oscillator, respectively, a sending and a receiving capacitance, a demodulator and a switching amplifier. The oscillator comprises a condenser which can be externally influenced. An active electrode, a ground electrode and a screening electrode that is arranged between these two electrodes are associated with this condenser. The active electrode and the screening electrode are at the same electrical potential due to the fact that the active electrode is driven in low impedance manner towards the shielding electrode by means of a driver stage. The active electrode and the screening electrode are connected by a line and are controlled by the same output of the control unit.

DE 32 21 223 A1 discloses a capacitive proximity initiator. This consists of a fully-insulated tubular housing having a sensor electrode arranged at the end thereof. A guard electrode and a screening electrode are associated with the sensor electrode. The screening and guard electrodes are distinguished by their cylindrical ring-like shape. The protection and screening electrodes are arranged in the interior of the housing such as to be mutually coaxial, whereby the guard electrode is located at a short distance from the sensor electrode which is arranged at the end. The screening electrode is set at a short spacing from the guard electrode. The guard electrode is operated as an 'active guard' and is connected via an impedance converter 42 to the sensor electrode 13 so that the same signal as is present on the sensor electrode is continuously applied to the guard electrode.

From CH 661 391 A5, there is known a device for a circuit arrangement for switching electrical devices in non contact making manner. In this arrangement, a pulse generator delivers pulses to an electrode emitting an electrical field via a signal output of a driver circuit. The driver and evaluation circuit is connected at its signal input to a further electrode to which a reference potential is applied at the same time. Both electrodes are overlapped by a common electrode to form a condenser which detects changes in the surrounding field and is carried capacitively by the transmitting electrode. If, however, in an arrangement of this type an electrode is wetted with respect to a reference potential, e.g. a surrounding housing, then the electrical field is capacitively short circuited and it is no longer possible to detect changes in the surrounding field.

DE 697 19 321 T2 also depicts a displacement current sensor wherein an electrical field is produced and received by receiving electrodes. It is not apparent as to how the coupling to the driver/evaluation unit is effected.

DE 2 239 359 A depicts a capacitive rain sensor wherein the transmitting electrode is screened with respect to the receiving electrode by a ground electrode. Consequently, the detection of a change resulting from the approach of an object is easily affected by other environmental influences. The presence of humidity leads to a change in amplitude.

U.S. Pat. No. 7,019,540 B2 depicts an electrostatic microphone in which a voltage divider is provided. Consequently, there are different signals at different parts of the active resonant circuit. It is not apparent as to how the coupling to the driver/evaluation unit is effected.

BRIEF SUMMARY

Based upon this state of the art, the invention is intended to produce a capacitive sensor with the aid of which changes in the field surrounding the sensor can be reliably detected and which is also insensitive to a reference potential in the event of being coated or wetted.

Basically in accordance with the invention, there are provided at least one transmitting electrode and at least one further electrode. The transmitting electrode produces the electrical field, whilst the further electrode picks up or receives this field and then likewise radiates it. The transmitting electrode is connected in low impedance manner, preferably in very low impedance manner (e.g. less than or equal to 200 ohms) to a control unit, whilst the further electrode is connected to the control unit in high impedance manner and is not fed by the control unit with a signal for the production of the electrical field. Rather, a signal is tapped off the further electrode in high impedance manner, this signal serving as an indicator for a change in the capacitance between the further electrode and a reference potential. The essential difference with respect to the state of the art is that the signal from the transmitting electrode is not tapped from the sensor electrode as in the state of the art, e.g. using a "high impedance" input of an impedance converter, and then passed on in "low impedance" manner to a screening electrode/guard electrode. Instead, the transmitting electrode is fed with its own signal which is completely independent from the sensor electrode that is referred to herein as the further electrode.

This means: that if the "signal" on the sensor electrode changes for any reason at all, e.g. it is reduced in consequence of being wetted, the signal on the transmitting electrode is not reduced as in the state of the art, but rather, it remains unaffected or is even increased.

In the state of the art, a coating of water would slightly increase e.g. the capacitance between a sensor surface and reference earth and consequently the voltage at the sensor surface would become somewhat smaller. As a consequence, the voltage applied to the tracking "screening electrode" would also be smaller and the water would thus again exert a greater influence. The effect of the "screening electrode" on the moisture-effect is thus only small. The main effect of such a "screening electrode" could thus lie in the reduction of the capacitance between the sensor electrode and the corresponding earthing surfaces.

In the method in accordance with the invention, the transmitting electrode remains unaffected by any such type of change of the voltage on the sensor electrode. In the case of a theoretical "reduction" of the voltage on the sensor electrode due to the effect of water between the sensor electrode and a surrounding wet surface, the film of moisture will continue to be subjected to the original unaltered signal voltage either directly or capacitively by the transmitting electrode located therebetween. This leads to the voltage signal on the transmitting electrode being higher than it is on the sensor electrode. This is thus exactly the opposite of the solutions in the state of the art.

In consequence, a coating or a wetting of the device no longer plays a role and can no longer have an effect upon the detection of changes in the field surrounding the sensor. Here, the transmitting electrode is arranged between the further electrode and a reference potential or an element at the reference potential e.g. a metallic surrounding. This results in the effect of the transmitting electrode on a coating or a wetting being greater than the effect of the coating or the wetting on a capacitance between the receiving electrode (the further electrode) and the reference potential. In consequence, any possible coating also works as an element transmitting the electrical field, even if there is a connection of the coating to the reference potential.

A sinusoidal or rectangular sensor signal of e.g. 100 kHz is applied to a first transmitting electrode and, due to the capacitive effect between the transmitting electrode and the further electrode, the further electrode is caused to adopt substantially the same electrical potential although it does this independently, i.e. not due to the fact that a screening electrode is caused to track the voltage of the transmitting electrode as in the state of the art. Both the transmitting electrode and the further electrode thus transmit a sensor signal. The further electrode is not fed by the control unit with a signal for the production of the electrical field. For the purposes of determining the capacitance of the further electrode with respect to earth, the weakening of this signal on the further electrode is determined. The spurious effects caused by wetting or contamination can be prevented by virtue of having a low impedance linkage of the first transmitting electrode to the driver stage of the driver/evaluation unit and the coupling of the magnetic field into possible coatings or wetted regions as well as by having a high impedance linkage of the further electrode to the evaluation system of the driver/evaluation unit.

In order to ensure that the transmitting electrode exerts a greater electrical effect on the wetting or contamination than the wetting or contamination between the further electrode and the reference potential, the transmitting electrode, irrespective of whether it is in the form of a ring, a tube or is arranged as individual electrodes on common or neighboring surfaces, is preferably arranged with respect to the respectively associated surface in such a manner that its distance from the surface is less than the distance of the further electrode from the nearest surface and/or that it is of a greater size than the size of the further electrode.

Preferably, it should be ensured that the transmitting electrode producing the electrical field at least partly surrounds the further electrode, preferably at least in the direction of the reference potential. To this extent, a capacitive sensor can be used as a capacitive proximity sensor e.g. even in the frame of a car bumper, so long as the further electrode is surrounded by the transmitting electrode in so far as possible with respect to the reference potential e.g. the vehicle chassis.

Preferably, in the presence of a coating, the transmitting electrode is constructed in such a manner that, in the region where a coating or a wetting occurs on the sensor, the transmitting electrode couples the electrical field into the coating or the wetting in such a way that the coating or the wetting itself becomes a transmitting "electrode". Any adverse effect of a coating or contamination on the further electrode is thereby excluded.

Further features and advantages of the invention will be apparent from the Claims and the following description of preferred embodiments taken in conjunction with the drawings. Hereby, individual features of the different embodiments illustrated in the drawings can be combined in any desired manner without extending beyond the scope of the present invention.

BRIEF DESCRIPTION OF THE FIGURES

In the following, the invention will be described in greater detail on the basis of exemplary embodiments illustrated in the accompanying Figures. Therein.

DETAILED DESCRIPTION

The invention will now be described exemplarily in more detail with reference to the accompanying drawings. Nevertheless, the exemplary embodiments are only examples which are not intended to limit the inventive concept to a certain arrangement. Before the invention is described in detail, it should be pointed out that it is not restricted to the particular components of the device nor to the particular method steps, since these components and processes can vary. The terms used here are merely intended to describe special embodiments and are not used in a restrictive sense. If, moreover, the singular or indefinite articles are used in the description or in the Claims, these also refer to a plurality of these elements insofar as the general context does not make it unambiguously clear that something else is meant.

In the context of this application, the expressions "low impedance" and "high impedance" are used. A low impedance connection is present if the transmitting electrode 15 is connected to an output directly or via a resistance or a resistance network and the resultant capacitance with respect to earth amounts to 80 pF for example so that the signal on the transmitting electrode is "degraded" to such a small extent as to show no effect. An approaching object with a change of e.g. 1 pF will then have no effect on the output signal. High impedance means that a signal that is being sent over this resistance or this resistance network experiences a change when e.g. approaching an object, which said signal can be detected unambiguously and produces a measurable change in the measuring signal. In a concrete case, a low impedance connection in accordance with this definition is present within the region of e.g. <200 ohms, whilst a high impedance connection is present for a resistance within the region of e.g. >50 kOhm. Between these values, effects can be determined in the case of both the scenarios described. The values specified here depend on the measuring frequency being used. The important thing is that when an object is not being approached, the voltage on the further electrode 13 should be almost as large as the voltage on the transmitting electrode 15 due to the capacitance between the transmitting electrode 15 and the further electrode 13. This can be effected either by deriving the voltage from the further electrode 13 by means of a high impedance field-effect transistor or by a high impedance decoupling by means of a high impedance resistance into a relatively low impedance amplifier input.

Figure 7:
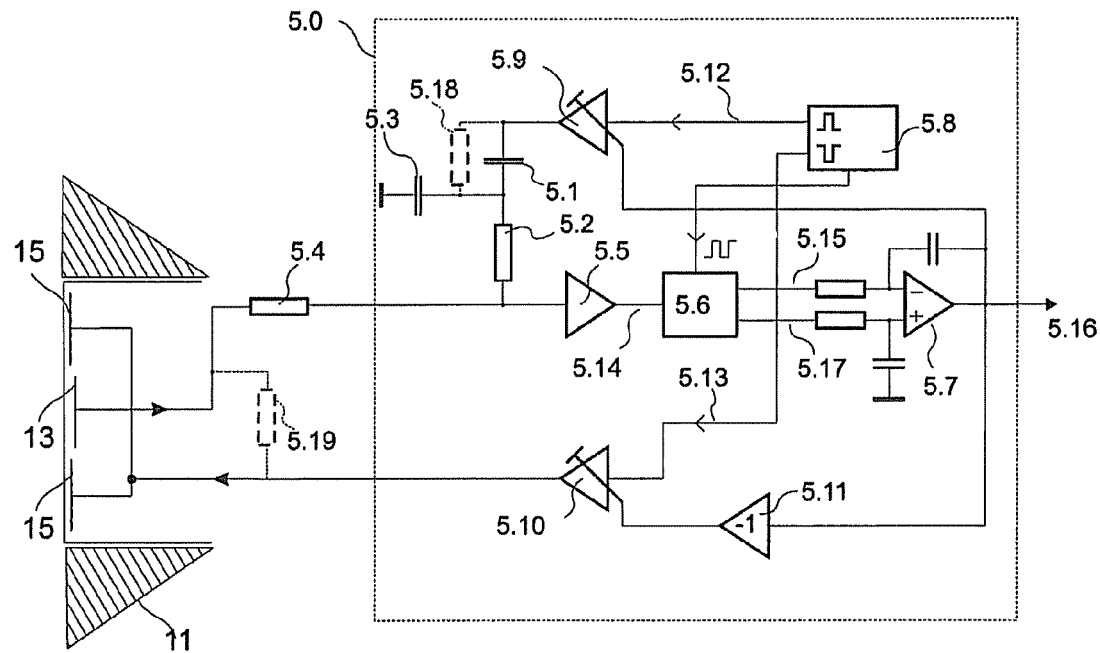
Figure 8:
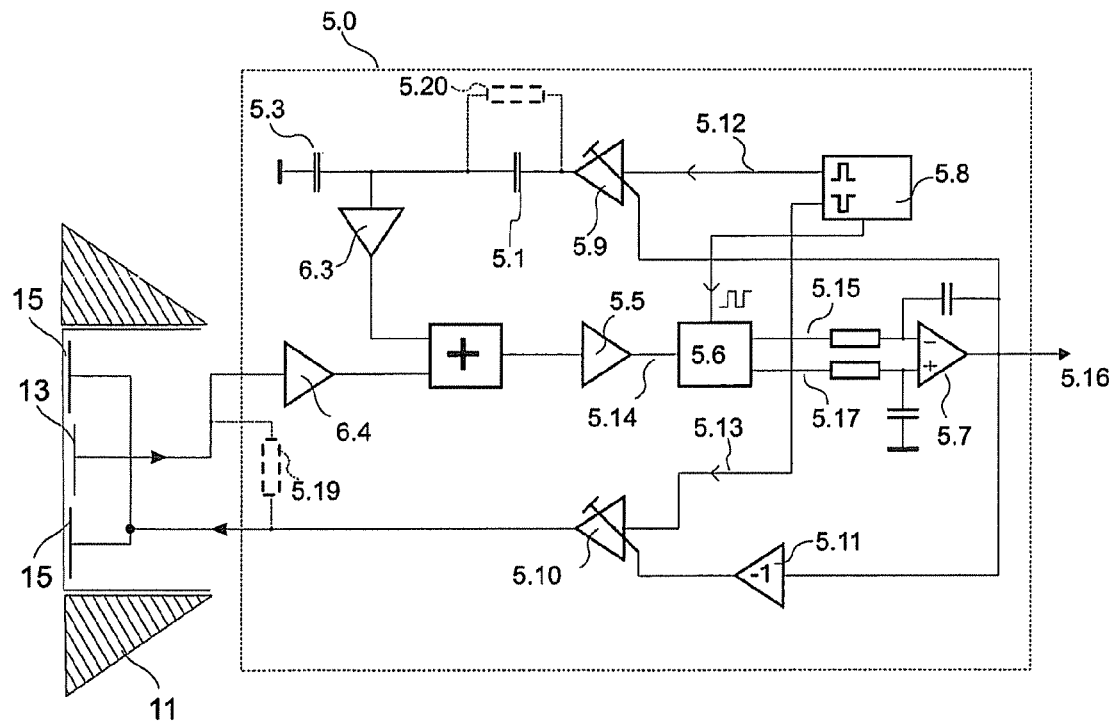

If the purely capacitive coupling between the transmitting electrode 15 and the further electrode 13 should be too small so that in consequence the same voltage cannot be established on the further electrode as on the transmitting electrode, then, as a supplementary measure, a high impedance resistance 5.18, 5.19, 5.20 and/or a further capacitance can be connected—as indicated in FIGS. 7 and 8 by the broken lines—between the transmitting electrode 15 and the further electrode 13.

Figure 1:
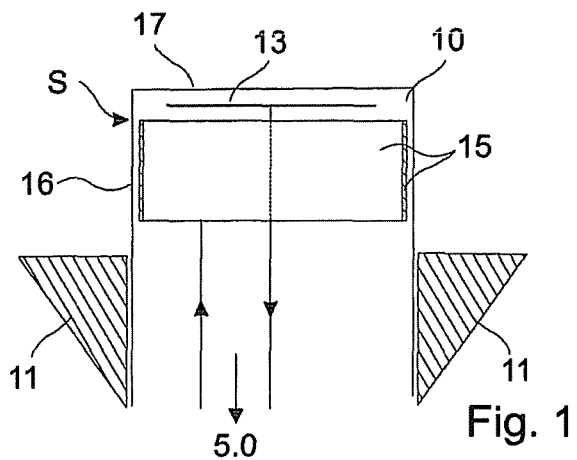
FIG. 1 shows a sectional view through a device comprising a sensor incorporating a cylindrical sensor head, FIG. 2 a sectional view through a device in a further embodiment comprising a planar sensor head, FIG. 3 a front view of a further shape of a sensor such as can be used in e.g. the region of a bumper of a vehicle, FIG. 4 a section through a sensor in accordance with FIG. 2 with lines of flux indicated therein, FIG. 5 an illustration in accordance with FIG. 4 when a coating or a wetting is present, FIG. 6 an illustration in accordance with FIG. 5 when nearing an object, FIG. 7 a block circuit diagram of a device in accordance with the invention for detecting capacitive changes, and FIG. 8 a block circuit diagram in accordance with FIG. 7, wherein summation resistances are replaced by impedance converters.
Figure 2:
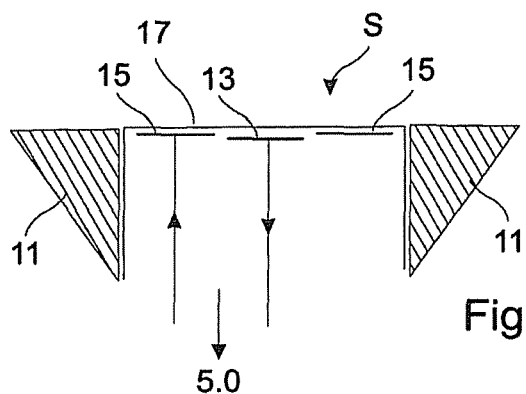
Figure 3:
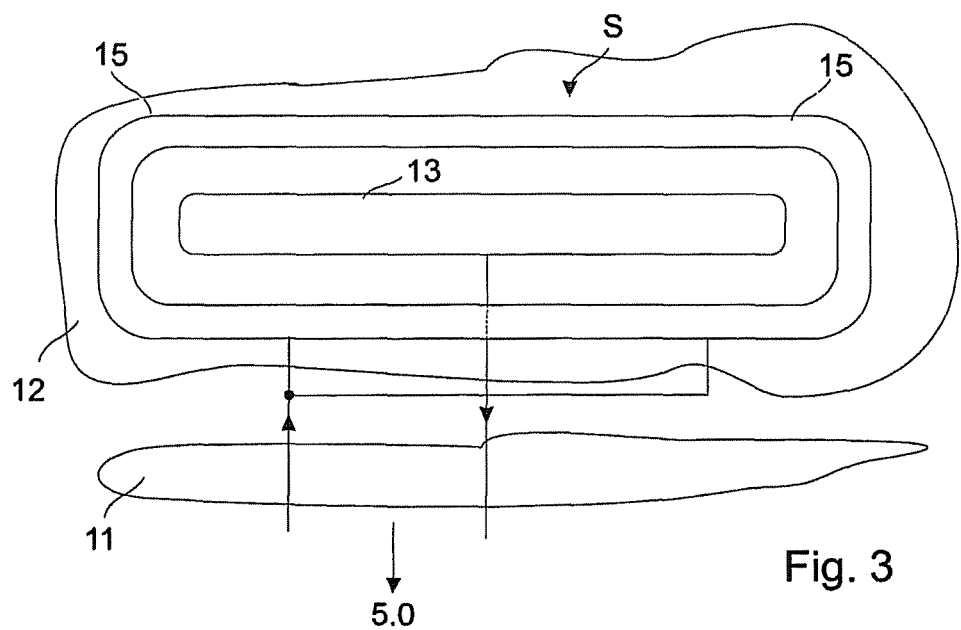
Figure 6:
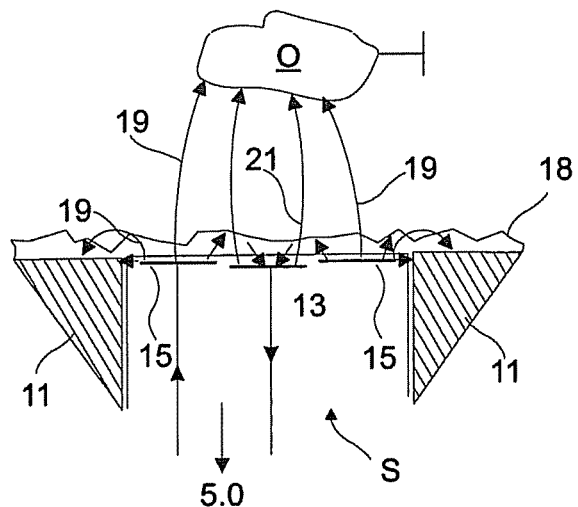

FIGS. 1 to 3 show devices for the capacitive measurement of changes in a sensor-active region of a sensor S. The sensor comprises at least two electrodes 13, 15 which are coupled in a suitable manner to a driver/evaluation unit 5.0 which is illustrated in FIGS. 6 and 7. To this extent, a plurality of electrodes could also be provided both as transmitting electrodes 15 or else as further electrodes 13 which are coupled capacitively to the transmitting electrode. FIG. 2 shows a ring-like transmitting electrode 15 which could also be formed alternatively by means of a plurality of transmitting electrodes.

The first electrode is preferably a tubular or annular transmitting electrode 15 for producing the electrical field. The driver/evaluation unit 5.0 serves for the evaluation of the changes measured by the sensor S. To this end, the sensor S is electrically connected to the driver/evaluation unit 5.0 in which a change of the electrical field and thus a change of the capacitances especially between the electrodes 13 and a reference potential, e.g. earth are detected and evaluated. During the course of a measurement of the capacitance with respect to the reference potential, the transmitting electrode 15 and the further electrode 13 are at substantially the same electrical potential so long as there is no change in the field surrounding the sensor due e.g. to the approach of an object O, whereby the transmitting electrode 15 in the sensor S is subjected to an alternating current signal. The further electrode 13 is coupled capacitively to the transmitting electrode 15 and is to this extent capacitively carried along therewith, i.e. the voltage is transferred from the transmitting electrode to the further electrode 13 which is the actual sensor electrode by means of a capacitive coupling, but, in contrast to the state of the art however, the two are not connected by an electrical line connection between the transmitting electrode 15 and the further electrode 13 as in the case of a screening electrode.

The substantial difference with respect to the state of the art thus is that the signal of the transmitting electrode 15 is not tapped off from the further electrode 13 serving as a sensor electrode e.g. using a "high impedance" input of an impedance converter and then passed on to a screening electrode/ guard electrode in "low impedance" manner as was the case in the state of the art. Instead, the transmitting electrode 15 is fed with its own signal independently of the further electrode 13. The transmitting electrode 15 is arranged between the further electrode 13 and a reference potential or an element 11 at the reference potential. To this extent, the driver/evaluation unit 5.0 possesses means for applying a first potential to the transmitting electrode 15 and means for measuring a capacitance between the further electrode 13 and an element 11 at the reference potential.

Figure 4:
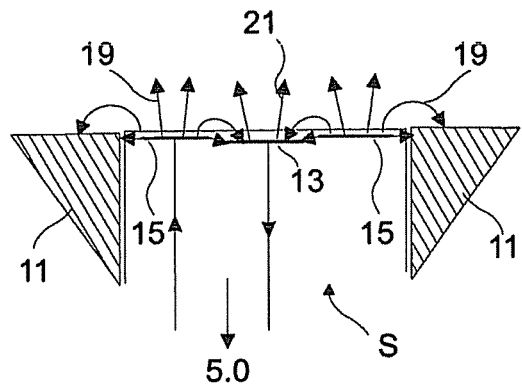

The at least one transmitting electrode 15 and the further electrode 13 can be embedded in a synthetic material or arranged with respect to each other in any other arbitrary manner. Appropriate manufacturing processes are known to the skilled person. The transmitting electrode 15 is fed with an alternating current signal and the further electrode 13 follows the signal waveform on the first transmitting electrode 15 due to the capacitance between the two electrodes 13, 15. The further electrode 13 thus radiates the alternating current signal into the field surrounding the sensor. Thus, without an object, the electrical lines of flux 19, 21 run in the surrounding field in accordance with FIG. 4. The capacitive coupling between the transmitting electrode 15 and the further electrode 13 can also be effected or supplemented by means of an externally connected capacitance.

This means: that if for any reason, the "signal" on the further electrode 13 changes, e.g. is reduced as a result of wetting, the signal on the transmitting electrode 15 is not reduced therewith as was the case in the state of the art, but remains unaffected or is even increased in accordance with the exemplary embodiment of FIGS. 7, 8.

In the state of the art, a coating of water would slightly increase the e.g. capacitance between the sensor surface and a reference earth and would thus somewhat reduce the voltage at the sensor surface. In consequence, the tracking "screening electrode" would also attain a smaller voltage and thus the water again has a larger influence. Consequently, the effect of the "screening electrode" on the moisture-effect is only small.

In the method in accordance with the invention, the transmitting electrode 15 remains virtually unaffected in the event of any type of alteration of the voltage on the further electrode 13 corresponding to the sensor electrode. In the case of a theoretical "reduction" of the voltage on the further electrode 13 due to the influence of water between the further electrode and the surrounding wet surface, the moisture film continues to be subjected directly or capacitively to the original unaltered signal voltage due to the transmitting electrode 15 located therebetween. This leads to the voltage signal on the transmitting electrode 15 being higher than it is on the further electrode 13. In the exemplary embodiment of FIGS. 7, 8, the voltage on the transmitting electrode 15 is increased even in the case of a "reduction" of the voltage on the further electrode 13 so that the "reduction" of the voltage on the further electrode is counterbalanced. This is thus exactly opposite to the solutions in the state of the art.

The above mentioned "theoretical" influence of water is not measurable in the event that the lines of flux from the transmitting electrode 15 are coupled into the surrounding water film in an appropriate manner. Only the external approach of a conductive body towards the measuring device is detected.

In the state of the art, positive feedback is present due to the screening electrode tracking the potential of the transmitting electrode, whereas there is a negative feedback process in accordance with the invention.

Figure 5:
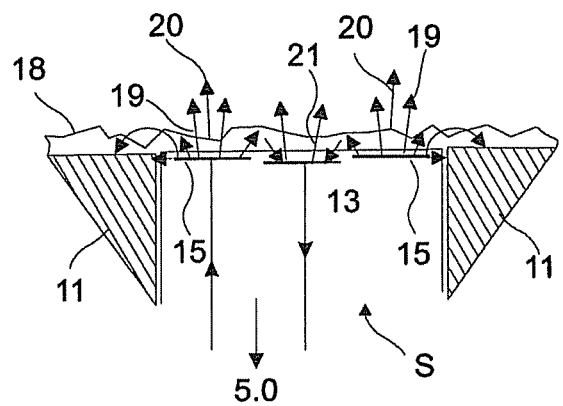

Since the further electrode 13 is preferably coupled purely capacitively to the transmitting electrode 15 and is thus kept at the same potential in the case where the signal is tapped off in high impedance manner, adverse effects due to humidity, wetting or a coating 18 in accordance with FIG. 5 have no effect. Namely, such layers of an electrically conductive liquid such as water for example, are held at the electrical potential of the two electrodes 13, 15 in a similar manner to the further electrode 13 and consequently do not lead to any alteration in the field of flux lines emanating from the further electrode 13. Rathermore, the wetted region itself emits electrical lines of flux 20 in accordance with FIG. 5.

In FIG. 6, there is an object O in the sensor-active region. Therein, for reason of clarity, the lines of flux 20 which are also being emitted here by the wetted region 18 are omitted. In accordance with FIG. 6, there is a change in the sensor-active region due to the object O since the further electrode 13 also forms amplified lines of flux 21 to the object. In consequence, there is a voltage drop on the further electrode 13 which is detected by the driver/evaluation unit 5.0 as described hereinbelow.

The sensor S can, for example, be constructed in accordance with an arrangement that is illustrated there in FIGS. 1 to 3. The distance of the electrodes 15 from the exterior surface of the sensor S is preferably relatively small in order to obtain a comparatively large capacitance. Preferably, the transmitting electrode 15 is arranged in such a way that the distance thereof to the respective nearest surface 16 in FIG. 1 or 17 in FIG. 2 is less than the distance of the further electrode 13 from its nearest surface 17. In analogous manner, the size of the transmitting electrode can also be greater than the size of the further electrode. In this way, a capacitance between the further electrode 13 and the exterior surface of the sensor S is smaller than the capacitance between the transmitting electrode and the exterior surface of the sensor so that a possible wetting or contamination 18 of the exterior surface is affected rather by the transmitting electrode than by the further electrode. To this end, the transmitting electrode is controlled in low impedance manner. The influence of the wetting on the electrical field produced by the transmitting electrode remains small. In principle, the transmitting electrodes are constructed in such a way that they can still emit an electrical field and introduce it into the coating or the wetting 18 wherever a coating or a wetting 18 occurs.

In accordance with FIG. 1, the transmitting electrode 15 can have annular or tubular form, although it is equally possible for it to be disk-shaped in accordance with FIG. 2. In like manner however, two or more electrically interconnected transmitting electrodes could also be provided. In accordance with FIG. 1, the apparatus is arranged in a cylindrical housing 10 at the front end whereof the ring-like transmitting electrode 15 is arranged on the cylinder walls, whilst the further electrode 13 is arranged at the end. The further electrode 13 can be arranged both within the ring and at the end in front of the ring. It is also conceivable for the transmitting electrode to cover the further electrode 13 at the rear in order to thereby shield it from rearward influences i.e. to shield it in the downward direction in FIG. 1.

In an arrangement in accordance with FIG. 2, the at least one transmitting electrode 15 and the further electrode 13 can also be arranged approximately in a plane preferably parallel to a common surface 17.

The view in accordance with FIG. 3 could be the front view of a bumper of a vehicle, whereby the bumper is e.g. a plastic part 12 on which the two electrodes 13, 15 are arranged. If water should run in the plane of the sheet over the bumper, this will have no effect upon the capacitance between the further electrode 13 and an element 11 at a reference potential such as the vehicle chassis for the aforementioned reasons.

In each of the embodiments however, the basic principle applies that a transmitting electrode does not need to be arranged at a point where there is no direct proximity of a reference potential so that the transmitting electrode 15 can only partly surround the further electrode 13.

Exemplary circuit diagrams for the driver/evaluation unit 5.0 are illustrated in FIGS. 7 and 8 which are intended to clarify the functioning of the invention and the driver/evaluation unit 5.0. Here, the arrangement in accordance with FIG. 2 is selected for the sensor, although the alternative arrangements in accordance with FIGS. 1 and 3 could likewise be employed and other arrangements are also conceivable for the skilled person. This does not change anything insofar as the functioning of the invention and especially the functioning of the driver/evaluation unit 5.0 is concerned. Taken with reference to FIGS. 7 and 8, it is merely the elements differing from the driver/evaluation unit 5.0 of FIG. 7 that are described in detail in conjunction with FIG. 8. In all other respects, elements which are provided with the same reference symbol are identical or at least functionally the same.

In the driver/evaluation unit 5.0, a clock pulse generator 5.8 delivers a first clock pulse signal 5.13 to a first amplitude regulator 5.10 and a second inverted clock pulse signal 5.12 to a second amplitude regulator 5.9. The low impedance output of the first amplitude regulator 5.10 and thus the output of the driver/evaluation unit 5.0 is connected to the transmitting electrode 15. The latter transmits the first clock pulse signal 5.13 to the further electrode 13 due to capacitive effects. An electrical line connection between the transmitting electrode 15 and the further electrode 13 preferably does not exist. The signal on the further electrode 13 is passed to the input of the alternating voltage amplifier 5.5 via the high impedance summation resistance 5.4. The second clock pulse signal 5.12, which is inverted with respect to the first clock pulse signal 5.13, is passed on via the second amplitude regulator 5.9 to the reference series capacitance 5.1 and via a second high impedance summation resistance 5.2 to the input of the alternating voltage amplifier 5.5. The input of the alternating voltage amplifier 5.5 is also the input of the driver/evaluation unit 5.0. The reference series capacitance 5.1 should be of approximately the same size as the mutual capacitance of the electrodes 15 and 13. The capacitance of the further electrode 13 occurring with respect to the surroundings thereof can be compensated for by the parallel condenser 5.3. The summation resistances 5.2 and 5.4 should preferably be of high impedance and have the same values.

By appropriate adjustment of the amplitude, the previously summed clock pulse signals 5.12 and 5.13 at the input of the amplifier 5.5 which is preferably in the form of an alternating voltage amplifier cancel each other out. Since, in the ideal case, the amplifier 5.5 only sees noise at the input thereof after the mutual cancellation of the clock pulse signals, it can have a very high amplification factor or be implemented in the form of a high amplification factor limiter amplifier.

The output signal 5.14 of the amplifier 5.5 is supplied to the synchronous demodulator 5.6. The output signals of the synchronous demodulator 5.6 that can be associated with the two clock pulse signals 5.12 and 5.13 are checked by the integrating comparator 5.7 for amplitude differences. The comparator 5.7 can be implemented as a high amplification factor comparator circuit. Each deviation of the input voltage 5.15 and 5.17 no matter how small leads to a corresponding deviation of the control value 5.16 from the instantaneous value thereof. The amplitude regulators 5.9 and 5.10 are controlled in mutually inverted manner by means of the inverting stage 5.11 using the control value 5.16. If the output amplitude of one amplitude regulator rises, then it drops accordingly in the other one. Consequently, the input signal of the alternating voltage amplifier 5.5 is kept constantly at zero, i.e. there are no clock synchronous signal components contained therein.

If, for example, the capacitance of the further electrode 13 changes with respect to the reference potential due to an object O, this additional capacitance together with the capacitance between the electrodes 15 and 13 works in a similar manner to a capacitive voltage divider and the voltage on the further electrode 13 decreases accordingly. This decrease leads to incomplete cancellation of the clock pulse signals 5.12 and 5.13 at the input of the amplifier 5.5. Following the synchronous demodulation process in the synchronous demodulator 5.6 and the evaluation of the deviation of the differences in the separated signal components of the input voltages 5.15 and 5.17, this leads to a deviation of the control value 5.16. This control value 5.16 can then be used for displaying the change that has taken place in the sensor-active region of the sensor S. The deviation in the control value 5.16 will rise or fall with respect to a previous value until such time as the clock pulse signal 5.13 and the inverted clock pulse signal 5.12 have completely cancelled each other out again at the input of the alternating voltage amplifier 5.5.

Incidentally, the summation resistances 5.2 and 5.4 shown in FIG. 7 could also be replaced by condensers or by series circuits composed of resistances and condensers. Advantageously, the summation resistances 5.2 and 5.4 in accordance with FIG. 6 could also be implemented by impedance converters 6.3 and 6.4 having high impedance inputs as is illustrated in FIG. 8. The information signal on the further electrode 13 is not adversely affected by such active circuits.

The apparatus in accordance with the invention for the capacitive measurement of changes within a sensor-active region can be used in the most diverse of fields. For example, the detection of nearing objects or media is possible in industrial applications. Further applications are conceivable in the field of industrial plants as well as in the field of robotics. There are also many possibilities for application in the automobile and commercial motor vehicle field, for example, for detecting movements on, in or around the vehicle. In principle, the apparatus can be employed anywhere where there is a need to detect changes in an electrical field, but any possible coating is not intended to be seen.

It is self-evident that this description can be subjected to the most diverse of modifications, changes and adaptations which fall within the scope of equivalents to the appended Claims.

The invention claimed is:

1. Apparatus for the capacitive measurement of changes in a sensor-active region of a sensor utilizing the production of an electrical field, wherein the sensor comprises at least two electrodes of which at least a first electrode is an at least one transmitting electrode producing the electrical field, and also a driver/evaluation unit for the evaluation of the changes measured by the sensor, wherein the at least one transmitting electrode is coupled to at least one further electrode and is arranged between the at least one further electrode and a reference potential and produces an electrical field by means of the driver/evaluation unit when in operation, wherein an output of the driver/evaluation unit is coupled to the at least one transmitting electrode and an input of the driver/evaluation unit is coupled to the at least one further electrode, wherein the at least one transmitting electrode and the at least one further electrode are fed with an independent signal with negative feedback, so that the at least one transmitting electrode transmits a first sensor signal having a first voltage and the at least one further electrode transmits a second sensor signal having a second voltage, the negative feedback generating a counterbalance effect that prevents reduction of the second voltage in response to reduction of the first voltage, and wherein an electrical field is formed between the at least one further electrode and the reference potential due to the electrical field between the at least one transmitting electrode and the at least one further electrode that is produced by the at least one transmitting electrode, wherein a change of the capacitance between the at least one further electrode and the reference potential is detected by means of the driver/evaluation unit, wherein the driver/evaluation unit has a signal generator, and is coupled to the at least one transmitting electrode in low impedance manner and to the at least one further electrode in high impedance manner, and wherein a high-impedance element is interconnected between the further electrode and the signal generator of the driver/evaluation unit to generate a high-impedance realized by the further electrode.

2. Apparatus in accordance with claim 1, wherein the at least one further electrode is coupled only capacitively to the at least one transmitting electrode.

3. Apparatus in accordance with claim 1, wherein the driver/evaluation unit comprises means for applying a first potential to the at least one transmitting electrode and means for measuring a capacitance between the at least one further electrode and an element at the reference potential.

4. Apparatus in accordance with claim 1, wherein an alternating current signal is applied to the at least one transmitting electrode by means of the driver/evaluation unit.

5. Apparatus in accordance with claim 1, characterized in that the at least one transmitting electrode and the at least one further electrode are arranged behind at least one outwardly facing surface of the sensor, wherein the spacing of the at least one transmitting electrode from the surface is smaller than the spacing of the at least one further electrode from the surface.

6. Apparatus in accordance with claim 1, characterized in that the at least one transmitting electrode is annular.

7. Apparatus in accordance with claim 5, wherein the sensor is arranged in a cylindrical housing at the front end of which the at least one transmitting electrode being annular is arranged on cylinder walls, while the at least one further electrode is arranged at the rear.

8. Apparatus in accordance with claim 1, wherein the at least one transmitting electrode and the at least one further electrode are arranged approximately in a plane preferably parallel to a common surface.

9. Apparatus in accordance with claim 1, wherein the at least one transmitting electrode at least partly surrounds the at least one further electrode.

10. Apparatus in accordance with claim 1, wherein the at least one further electrode is coupled capacitively to the at least one transmitting electrode and is at the same potential as the at least one transmitting electrode in the case where the signal is derived in high impedance manner, wherein, in the presence of a coating or a wetting on a housing of the sensor, the at least one transmitting electrode is formed in the region where a coating or a wetting occurs on the sensor, to couple the electrical field into the coating or the wetting such that the coating or the wetting itself becomes a transmitting "electrode".

11. An apparatus for the capacitive measurement of changes in a sensor-active region of a sensor utilizing the production of an electrical field, wherein the sensor comprises at least two electrodes of which at least a first electrode is an at least one transmitting electrode producing the electrical field, and also a driver/evaluation unit for the evaluation of the changes measured by the sensor, wherein the at least one transmitting electrode is coupled to at least one further electrode and is arranged between the at least one further electrode and a reference component that generates a reference signal, the at least one transmitting electrode producing an electrical field by means of the driver/evaluation unit when in operation, wherein an output of the driver/evaluation unit is coupled to the at least one transmitting electrode and an input of the driver/evaluation unit is coupled to the at least one further electrode, wherein the at least one transmitting electrode and the at least one further electrode are each fed with an independent signal so that the at least one transmitting electrode outputs a first sensor signal and the at least one further electrode transmits a second sensor signal, and wherein an electrical field is formed between the at least one further electrode and the reference potential due to the electrical field between the at least one transmitting electrode and the at least one further electrode that is produced by the at least one transmitting electrode, wherein a change of the capacitance between the at least one further electrode and the reference potential is based on a summation of the reference signal provided by the reference element and the second sensor signal provided by the at least one further electrode, wherein a summation element executes the summation and outputs a loop signal that is fed back to the at least one transmitting electrode to maintain the amplitude of the second sensor signal.

* * * * *